United States Patent
Fu et al.

(10) Patent No.: US 10,230,208 B2
(45) Date of Patent: Mar. 12, 2019

(54) HIGH-ENERGY FEMTOSECOND LIGHT PULSES BASED ON A GAIN-SWITCHED LASER DIODE

(71) Applicant: Cornell University, Ithaca, NY (US)

(72) Inventors: Walter Fu, Ithaca, NY (US); Frank W. Wise, Ithaca, NY (US); Logan Wright, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 15/939,250

(22) Filed: Mar. 28, 2018

(65) Prior Publication Data

US 2018/0287340 A1 Oct. 4, 2018

Related U.S. Application Data

(60) Provisional application No. 62/477,973, filed on Mar. 28, 2017.

(51) Int. Cl.

| | |
|---|---|
| *H01S 3/10* | (2006.01) |
| *H01S 3/08* | (2006.01) |
| *H01S 5/042* | (2006.01) |
| *H01S 5/065* | (2006.01) |
| *G02F 1/35* | (2006.01) |
| *H01S 5/00* | (2006.01) |
| *H01S 3/067* | (2006.01) |

(52) U.S. Cl.
CPC ........ *H01S 3/08013* (2013.01); *G02F 1/3526* (2013.01); *H01S 3/06725* (2013.01); *H01S 3/06741* (2013.01); *H01S 3/06754* (2013.01); *H01S 5/0057* (2013.01); *H01S 5/0078* (2013.01); *H01S 5/0428* (2013.01); *H01S 5/0656* (2013.01); *H01S 2301/08* (2013.01)

(58) Field of Classification Search
CPC .... H01S 5/0428; H01S 5/0078; H01S 5/0656; H01S 5/0057; H01S 2301/08; H01S 3/06725; H01S 3/06741; H01S 3/06754; H01S 3/0813
See application file for complete search history.

(56) References Cited

U.S. PATENT DOCUMENTS

| | | | |
|---|---|---|---|
| 9,031,100 B2* | 5/2015 | Wise | H01S 3/06725 372/6 |
| 9,140,959 B2* | 9/2015 | Kieu | G02F 1/395 |
| 2008/0089366 A1* | 4/2008 | Liu | H01S 3/067 372/6 |
| 2010/0086251 A1* | 4/2010 | Xu | G02F 1/3513 385/1 |
| 2012/0327960 A1* | 12/2012 | Wise | H01S 3/06725 372/6 |

* cited by examiner

*Primary Examiner* — Kinam Park
(74) *Attorney, Agent, or Firm* — Perkins Coie LLP

(57) ABSTRACT

This disclosed subject matter allows short pulses with high peak powers to be obtained from seed pulses generated by a gain-switched diode. The gain-switched diode provides a highly stable source for optical systems such as nonlinear microscopy. The disclosed system preserves the ability to generate pulses at arbitrary repetition rates, or even pulses on demand, which can help reduce sample damage in microscopy experiments or control deliberate damage in material processing.

19 Claims, 9 Drawing Sheets

HIGH-ENERGY FEMTOSECOND LIGHT PULSES BASED ON A GAIN-SWITCHED LASER DIODE

CROSS-REFERENCE TO RELATED APPLICATION(S)

This patent document claims the priority to and the benefits of U.S. Provisional Patent Application No. 62/477,973, filed Mar. 28, 2017, the contents of which are incorporated herein by reference in their entirety.

STATEMENT REGARDING FEDERALLY SPONSORED RESEARCH

This invention was made with government support under Grant Number EB002019 awarded by the National Institutes of Health and Grant Number 1609129 awarded by the National Science Foundation. The government has certain rights in the invention.

TECHNICAL FIELD

The technology disclosed in this patent document relates to pulsed lasers.

BACKGROUND

Energetic light pulses with short durations are used in numerous applications in science, industry, and medicine. For example, femtosecond lasers can allow probing of living structures without damaging the structures. In industrial applications, ultrashort laser pulses may be used for cutting, drilling, and ablating. These applications and new applications may be enabled by shorter pulses. New techniques and technologies are needed to generate ultrashort pulses that are extremely stable and robust, and which can be realized at an affordable cost.

SUMMARY

Disclosed are methods and apparatuses for generating femtosecond optical pulses. In one aspect, a pulsed laser device is disclosed. The device includes a gain-switched diode laser to produce seed laser pulses. The device may further include a self-phase modulation device located in a path of the seed laser pulses to generate spectral fringes. The device includes a filter to transmit a spectral fringe to a device that converts the temporal intensity profile of the pulse to a parabolic shape. The device may include an optical amplifier located downstream from the self-phase modulation device, the filter, and the device that yields a pulse with parabolic shape. The amplifier increases the energy of the parabolic pulse. The device may further include a dechirping device located downstream from the optical amplifier to cause dechirping of the amplified laser pulse to generate near transform-limit output laser pulses with an amplified peak power. In some example embodiments, the pulsed laser device includes a spectral filter located downstream from the self-phase modulation device that isolates a spectral region of the self-phase modulated seed laser pulses, wherein the spectral filter performs pulse reshaping and compression in the temporal domain. In some example embodiments, the pulsed laser device includes a reshaping device providing self-phase modulation and normal group-velocity dispersion located downstream of the spectral filter to receive the filtered seed laser pulses and to nonlinearly reshape the filtered seed laser pulses into a parabolic waveform, wherein the reshaping device either preceeds nonlinear pulse amplification using amplification by parabolic pre-shaping or the reshaping device incorporates nonlinear pulse amplification using similariton amplification In another aspect, a method of generating ultra-short duration laser pulses is disclosed. The method may include generating seed pulses of light by a gain-switched laser diode. The method may further include performing spectral-temporal filtering on the seed pulses of light to generate filtered light pulses. The method may include propagating the filtered light pulses through a predetermined length of normally-dispersive medium to generate pulses with a parabolic temporal intensity. The method may further include amplifying the parabolic pulses to generate amplified pulses, wherein the amplifying is performed by a non-linear amplifier. The method may include performing dechirping on the amplified pulses to generate output pulses.

Any combination of the following features may be included. The dechirping device may include a linear dispersive delay line. The laser seed pulses may be about 10 picoseconds in duration. The output laser pulses may be 50-200 femtoseconds in duration. The optical amplifier may be a nonlinear amplifier. The light pulses may be propagated through a predetermined length of a normally dispersive medium to produce pulses with a parabolic temporal waveshape. The spectral fringe may be at a wavelength that is a short wavelength edge of a spectrum of the laser seed pulses or at a long wavelength edge of the spectrum of the laser seed pulses. The spectral fringe may be between the long wavelength edge and the short wavelength edge, wherein the spectral fringe is filtered by a bandpass filter. One of the spectral fringes may be selected using an optical bandpass filter. The seed pulses may be generated by a gain-switched laser diode. Spectral-temporal filtering may enable selection of a spectral fringe at a wavelength that is a short wavelength edge of a spectrum of the laser seed pulses, or at a long wavelength edge of the spectrum of the laser seed pulses, or at another wavelength between the short wavelength and long wavelength edges.

DETAILED DESCRIPTION

Figure 1A:
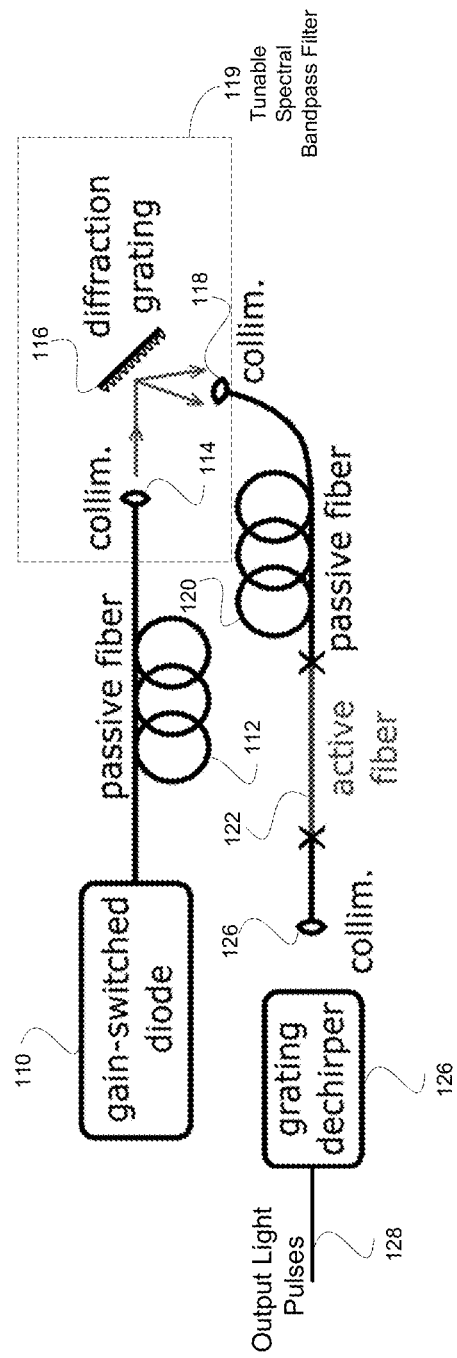
FIG. 1A depicts an example diagram of a femtosecond optical pulse generator, in accordance with some example embodiments.

The disclosed subject matter allows short pulses with high peak powers to be obtained from a gain-switched diode. The gain-switched diodes provide a highly stable source for optical systems in various applications, including, for example, nonlinear microscopy. The disclosed gain-switched diode devices and techniques enable the ability to generate pulses at different repetition rates, or pulses on demand, which can help reduce sample damage in microscopy experiments or control deliberate damage in material processing.

Gain-switched laser diodes are semiconductor devices that generate short light pulses, e.g., pulse durations as short as about 10 picoseconds and at different repetition rates. However, these pulses generally have complicated intensity profiles and poorly-controlled phase profiles. As a consequence, it is difficult to compress the pulses to shorter durations that are desired for many applications. Propagation in a nonlinear optical medium (e.g., optical fiber) causes a pulse to develop intensity-dependent spectral features, which can be filtered to isolate a shorter, better-characterized pulse. Subsequent nonlinear pulse propagation and amplification enables these new pulses to be further temporally compressed at high energies, yielding pulses with higher peak powers and shorter durations than are obtainable directly from a gain-switched diode.

Energetic light pulses with durations near 100 fs can have applications in numerous applications in science, industry, and medicine. Pulse energies near 1 microjoule may be used for many of applications. In some example embodiments, these pulse energies can be produced by fiber laser systems that include mode-locked lasers that generate nanojoule-energy pulses and an amplifier to boost the pulse energy to the microjoule level.

A short pulse of electrical current may be applied to a laser diode to generate a short light pulse in response. In some example embodiments, seed pulses for a femtosecond-pulse fiber amplifier are generated by a gain-switched diode. In some example embodiments, the pulse duration is compressed and the energy may be amplified. Because gain-switched diode lasers are opto-electronic devices, gain-switched diode lasers are less expensive to construct than mode-locked lasers.

Consistent with some embodiments is an optical device that generates, from seed pulse approximately 10 picoseconds in duration from a gain-switched diode, an output pulse with energy above 1 microjoule and duration of 150 femtoseconds. In addition to the much-shorter duration, the resulting pulses may have 10 times the peak power (or more) of pulses produced by prior systems based on gain-switched diodes.

The disclosed subject matter includes a two-stage sequence design. The first stage may use self-phase modulation of a pulse from a gain-switched laser diode to generate spectral fringes, which may be associated with high-intensity temporal features. The spectral fringes correspond to bands of wavelengths. Spectrally filtering the most extreme fringe may isolate a better-characterized, high-intensity pulse component from the original pulse. This process, may be referred to as nonlinear spectral-temporal filtering, and may result in pulse compression. In addition, because the most extreme fringes correspond to regions near a temporal phase inflection point, the output pulse may be nearly transform-limited. Filtering near one of the most extreme fringes is an example of spectral-temporal filtering. In another example, a spectral bandpass filter may be applied to any of the newly-generated spectral fringes and will generate a short pulse that may be slightly further from the transform limit but may still be compressed. In some implementations, bandpass filtering applied to newly-generated spectral fringes may possess lower pulse-to-pulse noise (i.e., amplitude jitter) than extreme fringe filtering.

The second stage may include amplification by parabolic pre-shaping. The filtered pulse from the first stage may undergo a predetermined amount of nonlinear propagation in a normally-dispersive medium, which may cause the filtered pulse to acquire a parabolic waveshape in time. This second stage further amplifies the pulsed light a in a strongly-nonlinear regime in which self-phase modulation generates bandwidth as a highly quadratic temporal phase. The amplified pulse can be de-chirped to near the transform limit using a linear dispersive delay line. In this manner, relatively long and ill-characterized pulses from a gain-switched diode can be cleaned-up, amplified, and compressed.

In some embodiments, amplification by parabolic pre-shaping may require an initial pulse that may not be obtainable from available gain-switched diodes unless nonlinear spectral-temporal filtering is first applied. Nonlinear spectral-temporal filtering and amplification by parabolic pre-shaping in series may result in pulse compression beyond the limit of either individual technique. Nonlinear propagation effects may be controlled via nonlinear spectral-temporal filtering and amplification by parabolic pre-shaping which causes high compression ratios with nearly transform-limited pulse quality.

FIG. 1A depicts an example of one implementation of a femtosecond optical source based on the disclosed technology. This optical source includes an optical seed pulse generator 110 such as a gain-switched laser diode that emits pulses having intense peaks of a short time duration with a semi-coherent background intensity of a longer duration. For example, the intense peaks maybe of a duration of about 10 picoseconds (ps) on top of the semi-coherent background. The pulses may be highly-chirped as the transform-limited duration is only 2 ps and the measured autocorrelation may be indicative of a complex residual phase.

The light pulses may be propagated through a length of passive optical fiber 112 which may cause the intense peaks to experience strong self-phase modulation and develop associated spectral fringes while the background undergoes a negligible spectral evolution. An example of a passive optical fiber is 112 is 10 meters of Nufern PM980-XP.

This optical source includes a tunable optical spectral bandpass filter 119 placed downstream from the passive optical fiber 112 to select the light energy within the output optical pulses from the fiber 112 to continue to propagate to another segment of passive optical fiber 120. The spectral fringe with either the longest or the shortest wavelength, corresponding to a region near a temporal phase inflection point, may be selected by the filter 119 to be coupled into the fiber 120. The tunable filter 119 may be implemented in various configurations, e.g., an interference filter, a birefringent filter, a fiber Bragg filter device, or a photonic crystal structure.

FIB. 1A shows a specific implementation of this tunable fiber 119 which includes an optical collimator 114 coupled to the end of the fiber 112 to collimate the output light from the fiber 112, and a diffraction grating 116 located to receive the collimated output light from the fiber 112 so that the diffraction by the diffraction grating 116 separates different spectral components within the optical pulses into different diffraction directions as a dispersed beam. A fiber collimator 118 is coupled to the fiber 120 and may be aligned at different positions relative to this dispersed beam from the diffraction grating 116. The spatial alignment of the collimator 118 with respect to the diffraction grating 116 can be adjusted to select a certain spectral portion of the spatially dispersed beam from the diffraction grating 116 to be coupled into the passive fiber 120. This collimator-grating-collimator assembly forms a tunable spectral bandpass filter with an adjustable center wavelength. Tuning of the spatial position of the collimator 118 may be performed by rotating an axis of the collimator 118 or displacing collimator 118 relative to diffraction grating 116. The spectral fringe with either the longest or the shortest wavelength, corresponding to a region near a temporal phase inflection point, may be selectively coupled into the fiber-pigtailed collimator 118. By tuning the collimator 118, a filtering of the wavelengths passed by collimator 118 is performed. Filtering around the red-most spectral fringe may separate the high-intensity component from the background while shortening it to 3 picoseconds (within a factor of 1.5 of the transform-limited duration). This process may be referred to as nonlinear spectral-temporal filtering, and is illustrated further in FIG. 2.

The above components in FIG. 1A collectively form the first stage to generate self-phase modulation and spectral fringes in the light pulses. The subsequent components in FIG. 1A form the second stage providing self-phase modulation and normal group-velocity dispersion to reshape the light pulses to have a parabolic waveform.

In the example shown in FIG. 1A for the second stage, the filtered light pulses output from the tunable filter 119 are amplified by parabolic pre-shaping. The filtered pulses are directed to propagate through a length of passive optical fiber 120 via the collimator 118. The construction of the fiber 120 and its length can be optimized either through simulations or experimentally to provide the desired optical self-modulation and a normal group velocity dispersion to the optical pulses output by the tunable filter 119 so that the optical pulses propagating in passive optical fiber 120 may experience self-phase modulation and normal group-velocity dispersion to possess a parabolic temporal intensity or nearly a parabolic temporal intensity at the other end of the fiber 120.

An optical amplification module 122 can be coupled to the fiber 120 to amplify the optical pulses with a parabolic temporal intensity or nearly a parabolic temporal intensity received from the fiber 120. The optical amplification module 122 may one or more optical amplifiers such as ytterbium-doped fiber amplifiers. During amplification, the pulses may experience strong self-phase modulation in which the parabolic intensity may transform into a quadratic temporal phase. In this manner, the pulses may experience an increase in bandwidth in a controlled manner. The pulses may then pass though collimator 124.

The pulses may then be de-chirped by dechirper 126 such as a dispersive delay line which may include a diffraction grating pair. A quadratic phase characteristic permits compression to near the transform-limited duration. Dechirper 126 then generates output light pulses 128.

In some implementations, nonlinear propagation leading up to and/or following the spectral filter 119 may occur in bulk media or nanostructured waveguides, rather than in optical fiber.

In some implementations, different optical fibers than the ones named here may be used, either for nonlinear propagation or for amplification.

In some implementations, amplification may occur in gain media other than rare-earth-doped optical fiber. For instance, solid-state amplifiers, thin disk amplifiers, Raman amplifiers, optical parametric amplifiers, or a combination thereof may suffice. Furthermore, multiple stages of amplification may be used, comprising any or all of the methods named.

In some implementations, the dispersive delay line used for the final pulse compression may take other forms, such as a prism compressor, a chirped fiber Bragg grating, a chirped volume Bragg grating, or photonic bandgap fiber.

In some implementations, amplification may be introduced between the laser source and the spectral filter for increased control over the nonlinear spectral-temporal filtering process. In some implementations, multiple nonlinear spectral-temporal filtering stages may be used in sequence to more precisely determine the pulse shaping and noise properties of the system.

In some implementations, other pulse sources may be used, such as those derived from mode-locked oscillators, Q-switched oscillators, gain-switched semiconductor amplifiers, Q-switched semiconductor amplifiers, or modulated diodes. While such an alternative might benefit less from the nonlinear spectral-temporal filter's pulse-cleaning effects than a gain-switched diode would, it would retain the benefits of combining two pulse compression methods.

In some implementations, the nonlinear spectral-temporal filter might make use of spectral fringes other than the most extreme ones.

In some implementations, attenuation of the Stokes wave generated through stimulated Raman scattering may be added before, between, or within amplification stages in order to reduce deleterious effects.

In some implementations, multiple sequential stages of spectral broadening followed by filtering one of the generated spectral fringes may be used to cause additional pulse compression, reshaping, and/or noise reduction prior to the final amplification stage(s).

In some implementations, amplification by parabolic pre-shaping may be replaced with another form of nonlinear amplification, such as self-similar or similariton amplification followed by de-chirping. To this end, the fiber in which the pulses become parabolic under the influence of normal dispersion and self-phase modulation might be eliminated. The amplifier that follows might be replaced with a longer amplifying element, such as a long, normally-dispersive, fiber amplifier, so as to promote the evolution of the filtered pulse into a similariton due to the latter's status as a global nonlinear attractor. Alternatively, a linear amplification method such as chirped-pulse amplification (CPA) by pulse stretching, pulse amplification and pulse compression may be substituted, though without the compressive capabilities of nonlinear amplification. Examples of self-similar or similariton amplification can be found in the U.S. Pat. No. 9,031,100 entitled "BROADBAND SHORT PULSE FIBER LASERS CAPABLE OF GENERATING OUTPUT SPECTRA BROADER THAN GAIN BANDWIDTH" and U.S. Pat. No. 8,787,411 B2 entitled "MODE-LOCKED FIBER LASER BASED ON NARROWBAND OPTICAL SPECTRAL FILTERING AND AMPLIFIER SIMILARITONS"

by the Cornell University, both of which are incorporated by reference in their entirety as part of the disclosure of this patent document.

Figure 1B:
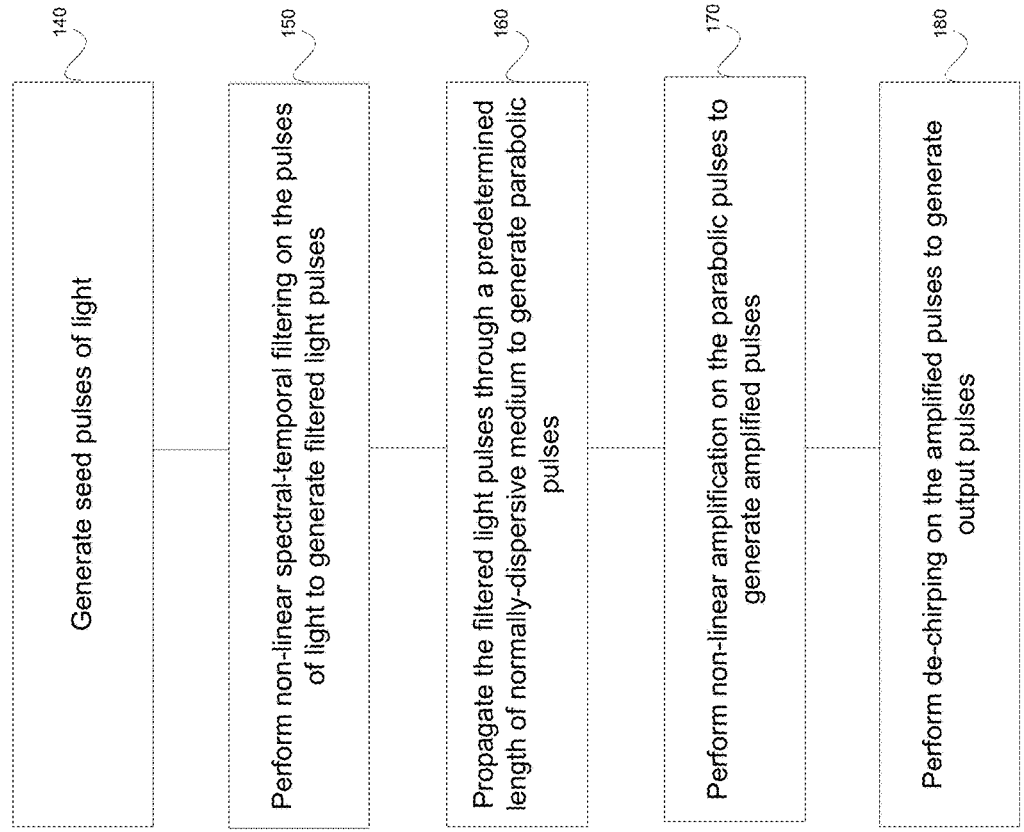
FIG. 1B depicts an example of a process for generating femtosecond duration light pulses, in accordance with some example embodiments.

FIG. 1B depicts an example of a process 135 for generating femtosecond duration light pulses, in accordance with some example embodiments. At 140, seed pulses of light are generated. At 150, spectral-temporal filtering is performed on the seed pulses to generate filtered light pulses. At 160, the filtered light pulses are passed through a normally dispersive medium to generate parabolic pulses. At 170, the parabolic pulses are amplified by a non-linear amplifier to generate amplified pulses. At 180, the amplified pulses are dechirped to produce output pulses.

At 140, seed pulses of light are generated. An optical seed pulse generator such as optical seed pulse generator 110 emits pulses consisting of intense peaks of short time duration light with a semi-coherent background intensity of longer duration. In some example embodiments, optical seed pulse generator is a gain-switched laser diode. For example, the intense peaks may have a duration of about 10 picoseconds (ps). The pulses may be highly-chirped may have a transform-limited duration of 2 ps and the measured autocorrelation may be indicative of a complex residual phase.

At 150, spectral-temporal filtering may be performed on the seed pulses to generate filtered light pulses. The seed pulses may be propagated through a length of passive optical fiber such as passive optical fiber 112 which may cause self-phase modulation of the peaks and may develop associated spectral fringes while the background undergoes negligible spectral evolution. The pulses may then be incident onto a diffraction grating such as diffraction grating 116 via a collimator such as collimator 114. Another collimator such as collimator 118 may be aligned to a dispersed beam. By tuning the alignment, a spectral bandpass filter with an adjustable center wavelength may be achieved. Tuning of the bandpass filter may be performed by rotating an axis of the collimator or displacing collimator 118 relative to the diffraction grating. By tuning the spatial alignment of collimator 118, a filtering of the wavelengths passed by collimator 118 is performed. Filtering around the red-most spectral fringe may separate the high-intensity component from the background while shortening it to 3 picoseconds (within a factor of 1.5 of the transform-limited duration). The filtered light pulses output from collimator 118 may then be amplified by parabolic pre-shaping.

At 160, the filtered light pulses are passed through a normally dispersive medium to generate parabolic pulses. The filtered pulses may propagate through a length of passive optical fiber such as optical fiber 120. The pulses propagating in the passive optical fiber may experience self-phase modulation and/or normal group-velocity dispersion. By the end of the length of the optical fiber, the pulses may have passively evolved to have a parabolic temporal intensity or nearly a parabolic temporal intensity.

At 170, the parabolic pulses are amplified by a non-linear amplifier to generate amplified pulses. The pulses may pass into one or more amplifiers such as ytterbium-doped fiber amplifiers. During amplification, the pulses may experience strong self-phase modulation in which the parabolic intensity may transform into a quadratic temporal phase. In this manner, the pulses may experience an increase in bandwidth. The pulses may then pass through another collimator.

At 180, the amplified pulses are dechirped to produce output pulses. The pulses may be de-chirped by a dechirper such as dechirper 126. The dechirper may be a dispersive delay line which may include a diffraction grating pair. A quadratic phase characteristic permits compression to near the transform-limited duration. The dechirper 126 then generates output light pulses 128.

Figure 2:
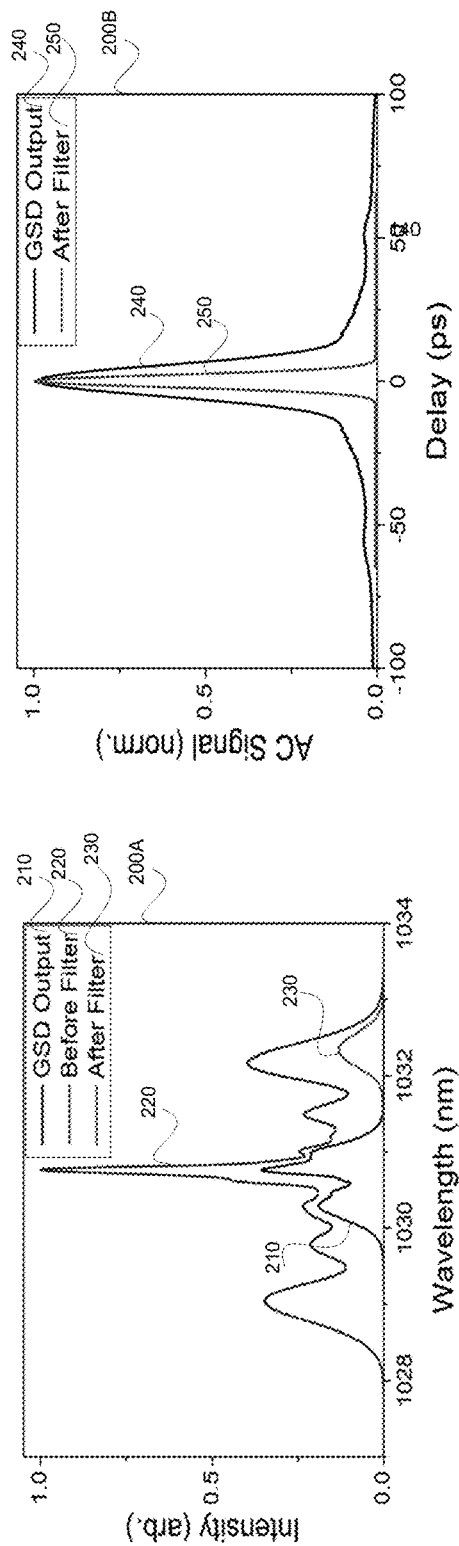
FIG. 2 depicts an example of the effects of nonlinear spectral-temporal filtering, in accordance with some example embodiments.
Figure 3:
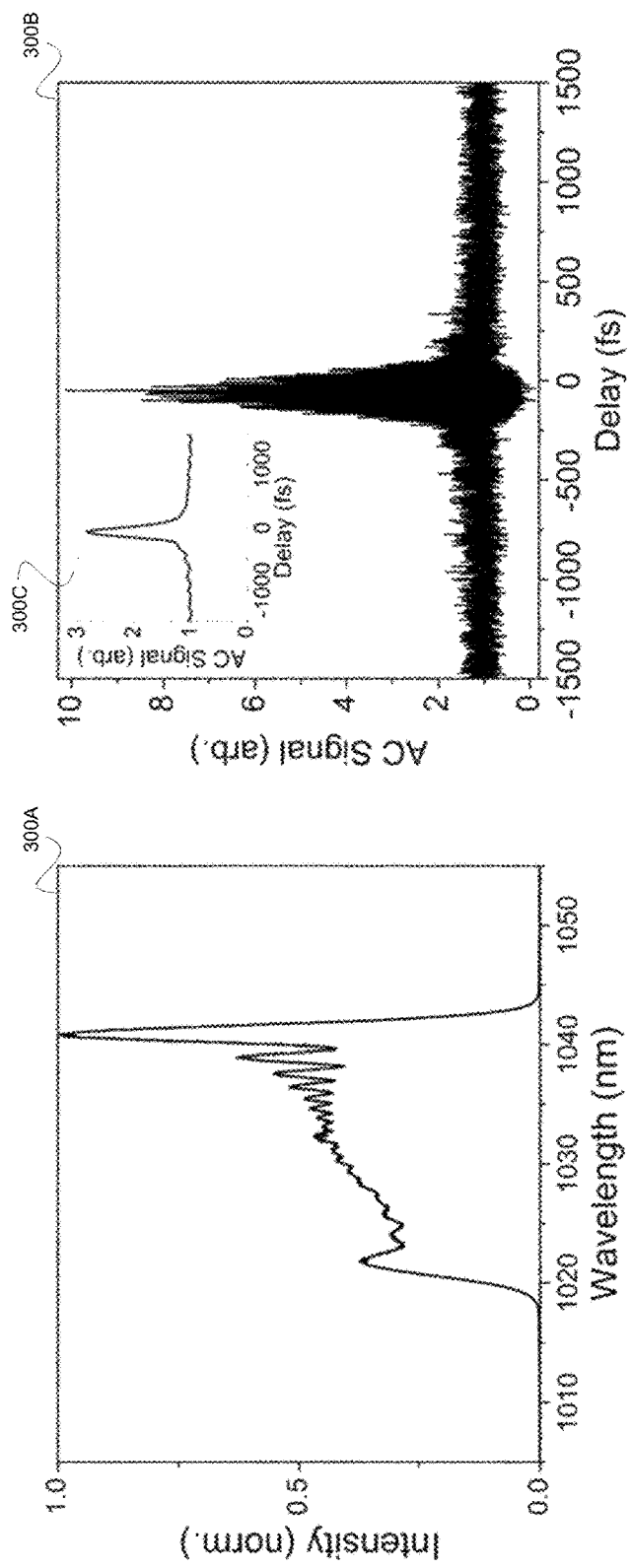
FIG. 3 depicts an example of intensity as a function of wavelength and another example of an intensity autocorrelation.

FIG. 2 depicts an example of the effects of nonlinear spectral-temporal filtering, in accordance with some example embodiments. At 200A is an example of pulse spectra at the output of a gain-switched diode is shown at 210. At 220, after propagation through passive fiber, and at 230 after filtering, with all plots rescaled for visibility. At 200B is an example of intensity autocorrelation taken before this process at 240 and after this process at 250. FIG. 3 depicts the results of amplification by parabolic pre-shaping which may be performed by passive fiber. For example, a Nufern PM980-XP fiber with an 11 meter length may be used to cause the filtered pulses to be parabolic. A ytterbium-doped fiber amplifier, or other amplifier may be used to amplify the pulses. For example, a Nufern PM-YSF-HI fiber amplifier may be used. The amplified pulses may be de-chirped using a grating compressor. Although specific fibers and fiber amplifiers are described above, other fibers and/or fiber amplifiers may be used as well.

FIG. 3 depicts an example of an output pulse having an energy of 28 nanojoules (nJ) with a time duration of 150 fs. The time duration in this example is within 15% of the transform-limited duration. Shown at 300A is an example of a graph of intensity as a function of wavelength for the example output pulse. At 300B is an example of interferometric autocorrelation for the output pulse. Shown in inset 300C is an example of a calculated intensity autocorrelation. This embodiment may yield a peak power of approximately 100 kilowatts.

Figure 4:
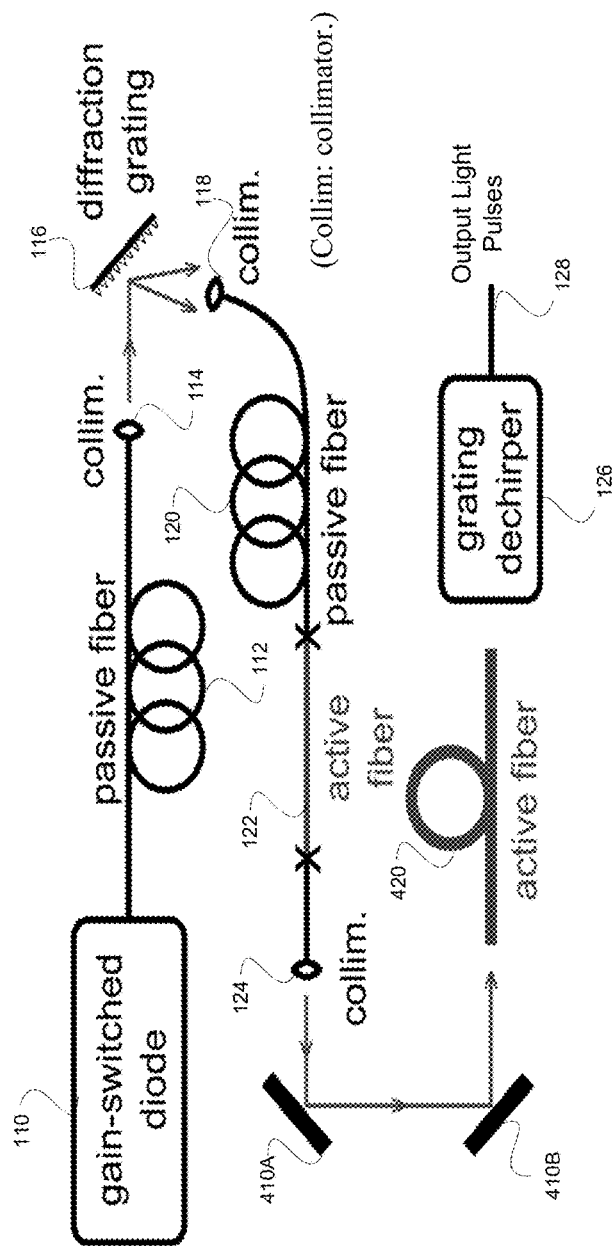
FIG. 4 depicts another example diagram of a femtosecond optical pulse generator, in accordance with some example embodiments.
Figure 5:
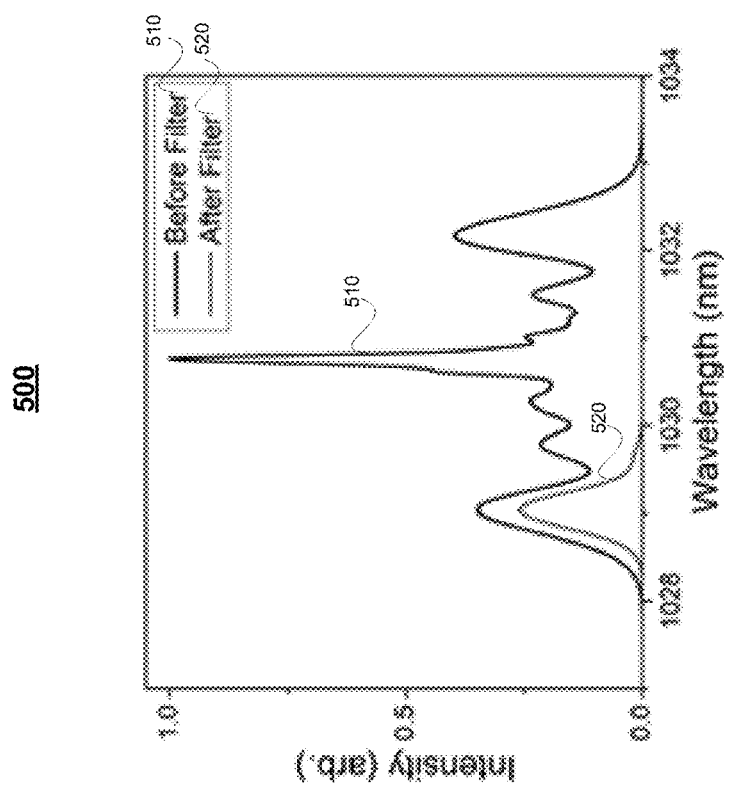
FIG. 5 depicts an example of a spectrum after spectral broadening of a gain-switched diode output before and after filtering.

FIG. 4 depicts another example for implementing the 2-stage design shown in the implementation example in FIG. 1A. FIG. 4, differs from FIG. 1A in that the implementation example in FIG. 4 includes a second additional fiber amplifier 420 to further amplify the pulse energy, e.g., a double-clad, ytterbium-doped fiber amplifier. For example, the second amplifier may be implemented to include a commercial fiber amplifier such as an nLIGHT 3 C® amplifier from the nLight Corporation. In this example, a 34 μm core diameter of the fiber may permit the previous result to be scaled to microjoule energies without significantly increasing the nonlinearity. One or more mirrors such as mirrors 410A and 410B may be used to provide the light path to accommodate compact packaging or for other reasons. A slightly different nonlinear spectral-temporal filter may be used in this case to reduce noise in the system. For example, FIG. 5 depicts an example of a spectrum after spectral broadening of the gain-switched diode output shown at 510, and after filtering shown at 520.

Figure 6:
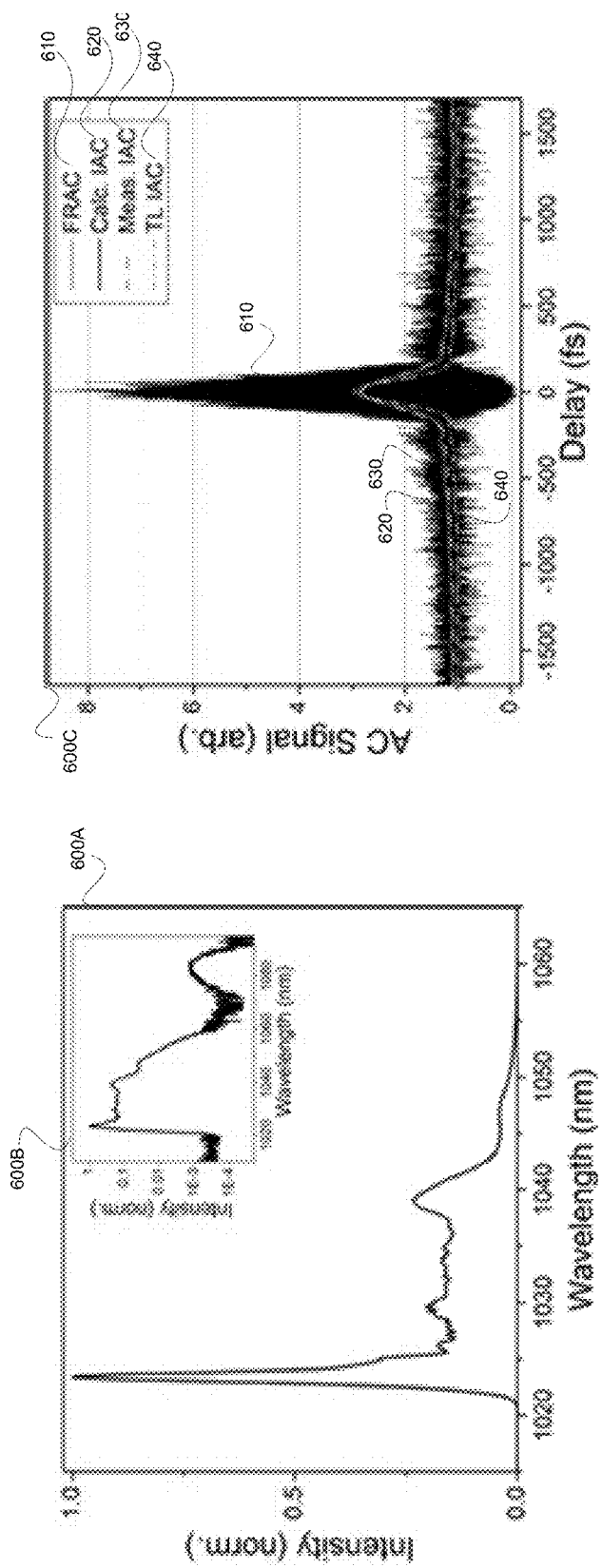
FIG. 6 depicts another example of intensity as a function of wavelength and an example plot of interferometric autocorrelation.

Following amplification in two stages as described above with respect to FIG. 4, an example of a resulting pulse is shown at FIG. 6. FIG. 6 depicts an example of an output pulse having 2.4 microjoules (μJ) of energy with a duration of 150 fs. Shown at 600A is an example plot of intensity as a function of wavelength. Inset 600B shows the spectrum on a semi-log scale. Shown at 600C is an example of interferometric autocorrelation at 610, calculated intensity autocorrelation at 620, directly-measured intensity autocorrelation at 630, and calculated transform-limited intensity autocorrelation at 640. This embodiment may yield a peak power of approximately 10 megawatts.

Figure 7:
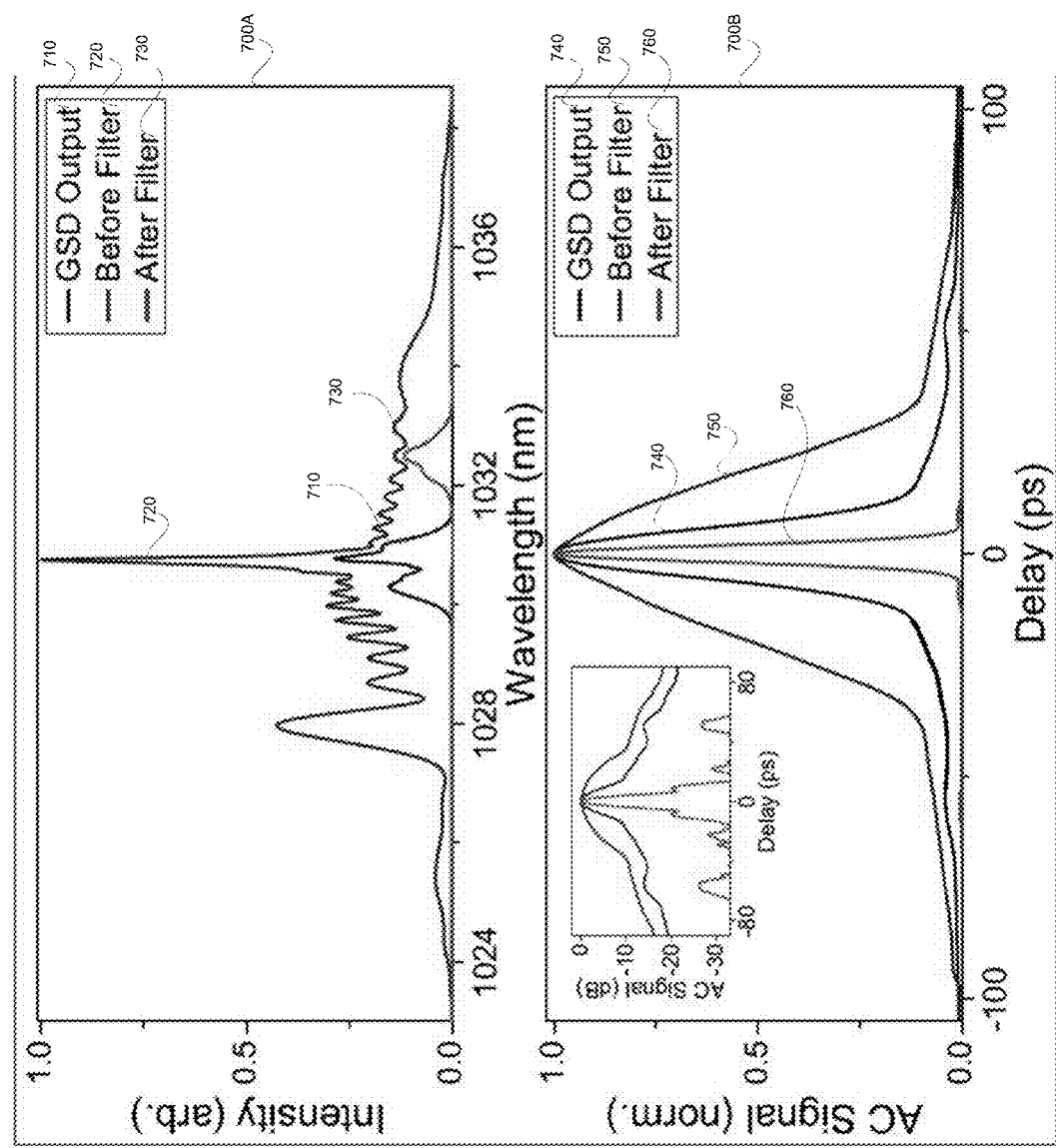
FIG. 7 depicts another example of a spectrum after spectral broadening of a gain-switched diode output before and after filtering.
Figure 8:
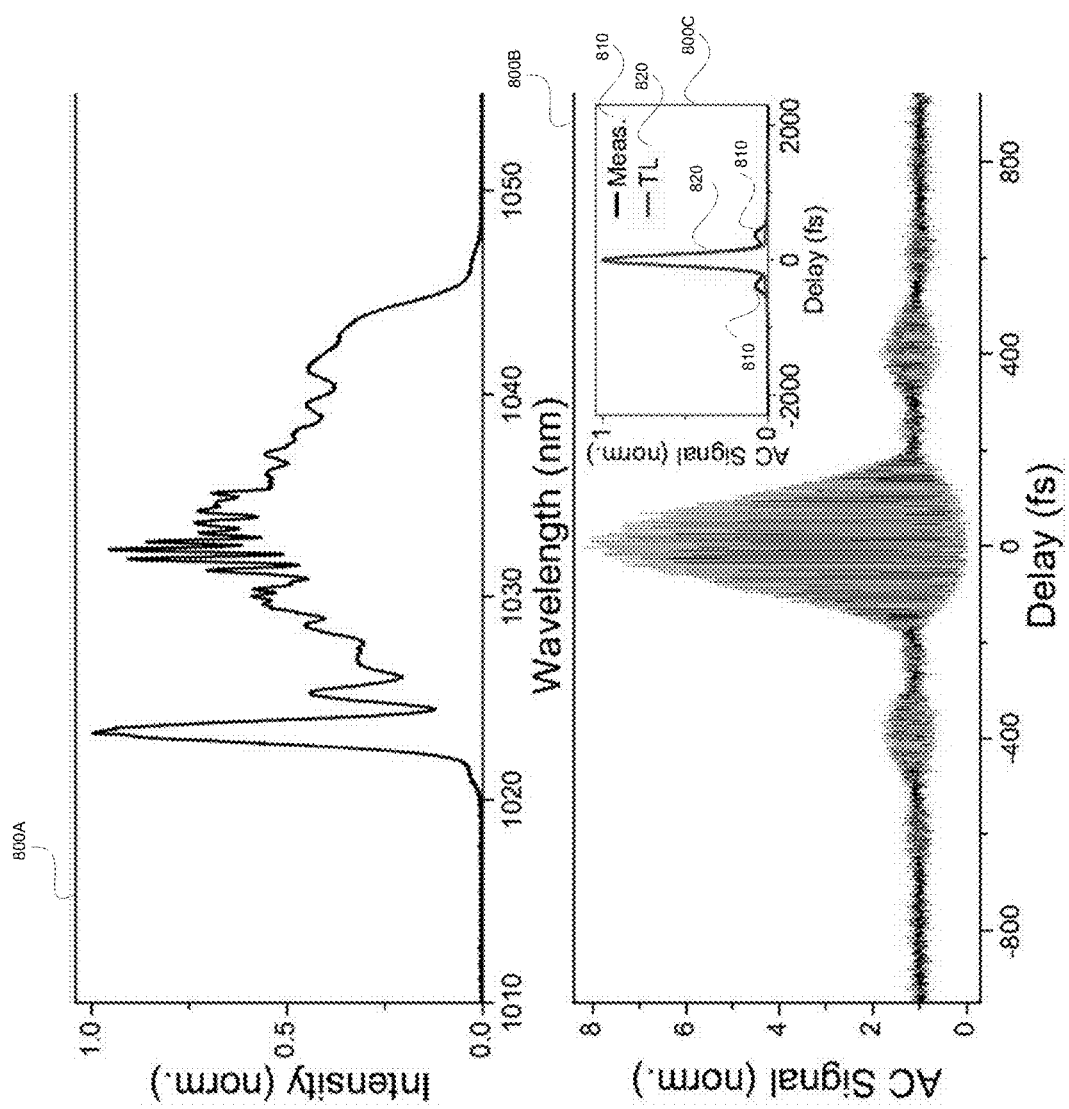
FIG. 8 depicts another example of intensity as a function of wavelength and another example of an intensity autocorrelation.

In another embodiment similar to FIG. 4, the nonlinear spectral-temporal filter is changed reduce the noise and improve the output pulse characteristics. The length of fiber used to impose self-phase modulation and generate spectral fringes prior to the spectral bandpass filter is different from that used in above. In this case, rather than isolating one of the most extreme spectral fringes, an intermediate fringe is filtered, which can be chosen to minimize the pulse-to-pulse fluctuations (for example, amplitude jitter) in this case. Pulses may be amplified by parabolic pre-shaping and dechirped at a grating compressor. In an example, output pulses may have an energy of 2.4 µJ and a duration of 140 fs with a 13 megawatt (MW) peak power. In this example the output pulses have approximately 10 times lower noise due to filtering an intermediate spectral fringe so as to minimize the noise in this case. FIG. 7 at 700A depicts examples of intensity as a function of wavelength for a GSD output at 710, before filtering at 720, and after filtering at 730. FIG. 7 at 700B depicts examples of autocorrelation at the GSD output at 740, before filtering at 750, and after filtering at 760. FIG. 8 at 800A depicts another example of intensity as a function of wavelength and at 800B an example of the interferometric autocorrelation. Inset 800C depicts the corresponding, calculated intensity autocorrelation at 810 and transform-limited autocorrelation at 820.

The disclosed subject matter allows short pulses with high peak powers to be obtained from a gain-switched diode. This constitutes a highly stable source for optical systems such as nonlinear microscopy. Furthermore, the disclosed techniques and technology preserve the ability of a gain-switched diode to generate pulses at arbitrary repetition rates, or pulses on demand, which can help reduce sample damage in microscopy experiments or control deliberate damage in material processing.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A pulsed laser device, comprising:
    a seed laser including a gain-switched diode laser to produce seed laser pulses;
    a self-phase modulation device located in a path of the seed laser pulses to produce a self-phase modulation on each of the seed laser pulses to generate spectral fringes in the seed laser pulses as self-phase modulated seed laser pulses;
    a spectral filter located downstream from the self-phase modulation device that isolates a spectral region of the self-phase modulated seed laser pulses, wherein the spectral filter performs pulse reshaping and compression in the temporal domain;
    a reshaping device providing self-phase modulation and normal group-velocity dispersion located downstream of the spectral filter to receive the filtered seed laser pulses and to nonlinearly reshape the filtered seed laser pulses into reshaped light pulses having a parabolic waveform;
    an optical amplifier to amplify the reshaped light pulses out of the reshaping device as amplified light pulses; and
    a dechirping device located downstream from the optical amplifier to cause dechirping of the amplified light pulse to generate near transform-limit output laser pulses with an amplified peak power.

2. The pulsed laser device as in claim 1, wherein the dechirping device includes a linear dispersive delay line.

3. The pulsed laser device as in claim 1, wherein laser seed pulses are about 10 picoseconds in duration.

4. The pulsed laser device as in claim 1, wherein the output laser pulses are 50-200 femtoseconds in duration.

5. The pulsed laser device as in claim 1, wherein the optical amplifier includes a nonlinear amplifier.

6. The pulsed laser device as in claim 1, wherein the reshaping device includes a predetermined length of a normally-dispersive nonlinear medium to cause the light pulses to have a parabolic temporal waveshape.

7. The pulsed laser device as in claim 1, wherein the spectral filter is a bandpass filter that filters the spectral fringes.

8. The pulsed laser device as in claim 1, wherein the spectral filter includes a diffraction grating and a fiber-pigtailed collimator to select different diffracted spectral components produced by the diffraction grating as a filtered output.

9. The pulsed laser device as in claim 1, wherein the reshaping device is structured to include a passive medium to provide the self-phase modulation and normal group-velocity dispersion and the optical amplifier downstream from the passive medium produces amplified light pulses with a quadratic temporal phase and an increased bandwidth to be further processed by the dechirping device.

10. The pulsed laser device as in claim 1, wherein the optical amplifier is structured to perform similariton amplification.

11. A method of generating ultra-short duration laser pulses, the method comprising:
    generating seed pulses of light;
    performing nonlinear spectral-temporal filtering on the seed pulses of light to generate filtered light pulses;
    propagating the filtered light pulses through a predetermined length of normally-dispersive nonlinear medium to generate parabolic pulses with a parabolic temporal intensity;
    amplifying the parabolic pulses to generate amplified pulses, wherein the amplifying is performed by a non-linear amplifier; and
    performing dechirping on the amplified pulses to generate output pulses.

12. The method of generating ultra-short duration laser pulses of claim 11, wherein the seed pulses are generated by a gain-switched laser diode.

13. The method of generating ultra-short duration laser pulses of claim 11, wherein the dechirping is performed by a linear dispersive delay line.

14. The method of generating ultra-short duration laser pulses of claim 11, wherein seed pulses are about 10 picoseconds in duration.

15. The method of generating ultra-short duration laser pulses of claim 11, wherein the output pulses are 50-200 femtoseconds in duration.

16. The method of generating ultra-short duration laser pulses of claim 11, wherein the optical amplifier is a nonlinear amplifier.

17. The method of generating ultra-short duration laser pulses of claim 11, wherein the light pulses are propagated through a predetermined length of normally dispersive medium to produce pulses with a parabolic temporal waveshape.

18. The method of generating ultra-short duration laser pulses of claim 11, wherein the performing the spectral-temporal filtering enables selection of a spectral fringe at a wavelength that is a short wavelength edge of a spectrum of the laser seed pulses, a long wavelength edge of the spectrum of the laser seed pulses, or between the long wavelength edge and the short wavelength edge, wherein the spectral fringe is filtered by a bandpass filter.

19. The method of generating ultra-short duration laser pulses of claim 11, wherein one of the spectral fringes is selected using a diffraction grating.

\* \* \* \* \*